United States Patent [19]
Hsu et al.

[11] Patent Number: 5,851,343
[45] Date of Patent: Dec. 22, 1998

[54] PROTECTIVE SHIELD AROUND THE INNER EDGE OF ENDPOINT WINDOW IN A PLASMA ETCHING CHAMBER

[75] Inventors: Yung-Mao Hsu; Ching-Chung Wu, both of Hsin-Chu, Taiwan

[73] Assignee: Taiwan Semiconductor Manufacturing Company, Ltd., Hsin-Chu, Taiwan

[21] Appl. No.: 857,961

[22] Filed: May 16, 1997

[51] Int. Cl.⁶ .............................. C23F 1/02; C23C 16/00
[52] U.S. Cl. ................................ 156/345; 118/723 MW; 118/723 ME; 315/111.21
[58] Field of Search ................... 156/345; 118/723 MW, 118/723 ME; 315/111.21

[56] References Cited

U.S. PATENT DOCUMENTS

| | | | |
|---|---|---|---|
| 4,952,273 | 8/1990 | Popov | 156/643 |
| 4,954,212 | 9/1990 | Gadriel et al. | 156/627 |
| 5,432,315 | 7/1995 | Kaji et al. | 219/121.43 |
| 5,567,268 | 10/1996 | Kadomura | 156/345 |

*Primary Examiner*—Benjamin Utech
*Assistant Examiner*—George Goudreau
*Attorney, Agent, or Firm*—George O. Saile; Stephen B. Ackerman; William J. Stoffel

[57] ABSTRACT

The present invention provides a protective shield for a plasma etcher. The protective shield 40 protects the chamber wall 30 around the etch detect window from plasma etching and electrical arcing. The invention comprises a plasma etcher 10 has a wall 30 surrounding a chamber 14. The wall has an opening 16. The wall 30 having an inside face 30A and an outside face 30B. An opening edge 30C defines the opening 16. A window 24 covers over the opening 16 and over a portion of the outside face 30B of the wall. The protective shield 40 covers the opening edge 30C around the opening 16 and a portion of the inside face 30A of the wall 30 around the opening 16. The shield 40 is composed of an electrically insulating and plasma resistant material whereby the protective shield 40 prevents the chamber from arching and generating particles and extends the lifetime of the wall 30.

15 Claims, 3 Drawing Sheets

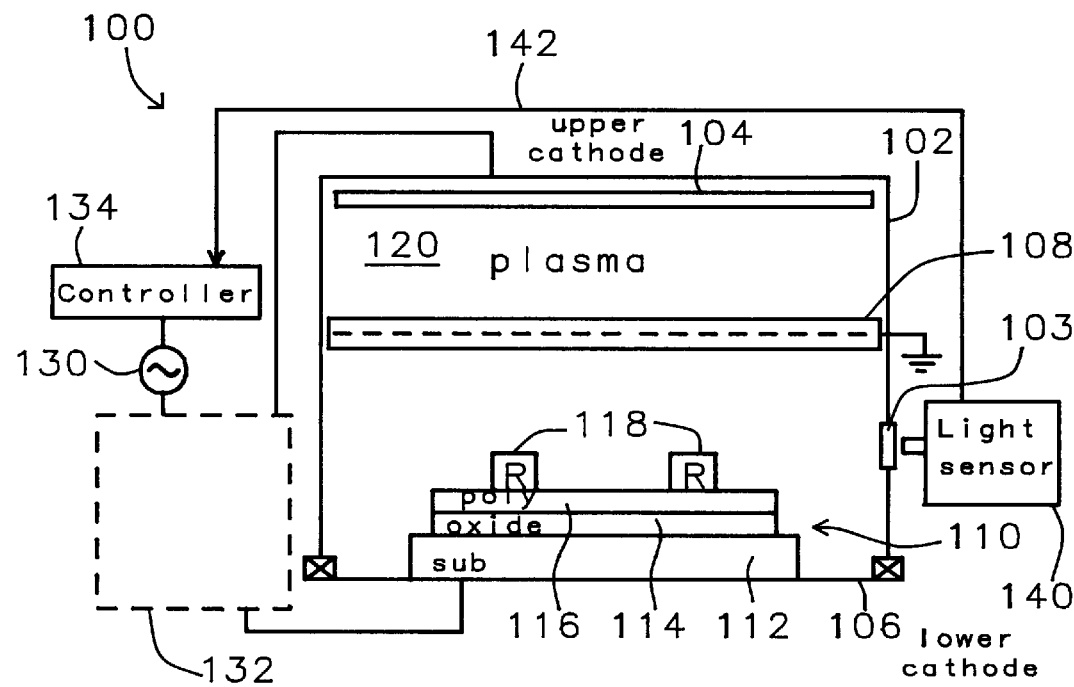
FIG. 1A – Prior Art
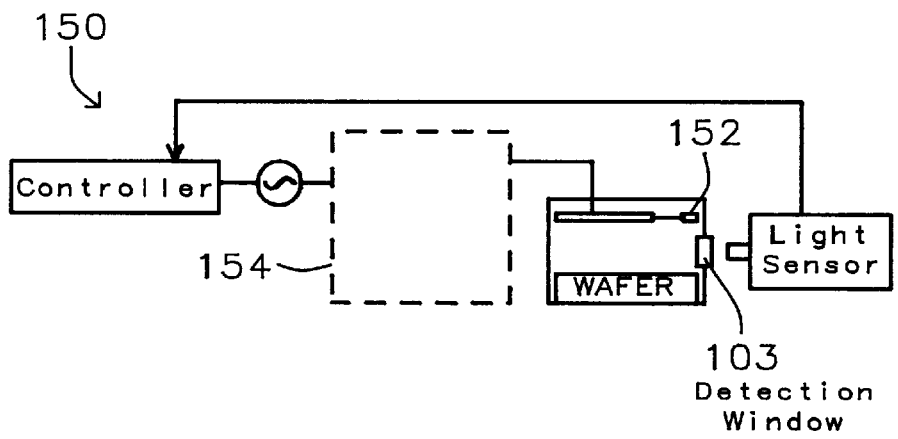
FIG. 1B – Prior Art

PROTECTIVE SHIELD AROUND THE INNER EDGE OF ENDPOINT WINDOW IN A PLASMA ETCHING CHAMBER

BACKGROUND OF INVENTION

1) Field of the Invention

This invention relates generally to plasma processing apparatus applied in the field for manufacturing, e.g., a semiconductor device and more particularly to a protective shield around the edge of an endpoint detect window in a plasma etcher.

2) Description of the Prior Art

Plasma etchers are frequently used in semiconductor manufacturing processes when a relatively straight vertical edge is needed. For instance, when etching the polysilicon gate of a MOS transistor undercutting the polysilicon can adversely affect the operation of the transistor. Under cutting is frequently encountered when etching is performed using a liquid etching method. Plasma etching which uses ion accelerated by an electric filed, tends to etch only horizontal exposed surfaces tend therefore avoids undercutting.

An important aspect of all etching processes is stopping the etching process after the layer etching has been removed but before the next layer down is destroyed. This is called "endpoint" detection—for detecting the completion of etching of a particular layer. While the chemicals used in an etching process are selected for their ability to etch a particular type of material, such as polysilicon, the etching chemical will dissolve the other materials on a semiconductor wafer if those material are exposed to the etching chemical for a significant period of time. For example, most etch chemicals used to etch polysilicon will also etch silicon oxide. If the silicon oxide used for forming a MOS transistor is completely etched away, the transistor will be destroyed and the wafer being processed will be scrap.

A typical triode etcher 100 is shown in FIG. 1A. A wafer 112 with an oxide layer 114, a polysilicon layer 116 and a photoresist pattern 118 is shown on the lower cathode 106 and under the screen anode 108. The plasma 120 is generated by the two cathodes 104 106 and screen anode 108. The plasma is used to etch the polysilicon layer 116 over the wafer 112. A controller 134 receives the signal from the optical sensor 140. The controller sends a signal to the impedance transformation circuit 132, which controls the power to the upper cathode 104, and the lower cathode 106. FIG. 1B shows a diode plasma etch system 150 with the components as described above.

In many plasma etching systems such as shown in FIG. 1A, the endpoint of the etching process is detected using a light or an optical sensor 140. The optic sensor 140 is mount outside the etch chamber 102 adjacent to a window 103 in the chamber wall 102. The window 102 is referred to as an endpoint detect widow. The optic sensor 140 receives light from the wafer surface that passes through the clear endpoint detect window 103 in the chamber wall. The optical sensor is setup using narrow bandpass filters, to monitor the intensity of light at a frequency associated with the layer being etching. When the measured intensity falls below a specified threshold, indicating that etching is complete, the sensor generates an endpoint signal that is transmitted to the controller, which turns off the power supply and there by stops the etching process.

The chamber walls have an anodized coating that acts an insulator between the chamber walls and the plasma. Generally, the chamber wall is grounded (V=0), and the electrical potential of the plasma is about volts 10 to 30 Volts. The insulating treatment (anodizing coating ) on the chamber walls normally provides good protection so that arcing does not occur between the chamber wall and the plasma. However, when the anodized coating is damaged or weakened, arcing occurs.

We have found a serious problem with current plasma etch processes and plasma chamber is that arcing occurs in the plasma chamber in the area around the endpoint detect window. The problem seems to be worse on etchers that have a horizontal end point detection window 103 as shown in FIGS. 1A and 1B (as opposed to a vertical orientated window where on would look down onto the wafer). We have found that the arcing around the windows occurs between plasma 120 or the cathodes and the chamber wall where the anodized coating has worn away, weakened, degraded, worn out or flaked away or where the wall has sharp edges.

The arcing we observe is between the chamber 102 and the anodized chamber coating/chamber wall at the corners of the chamber wall near the window 103. The arcing problem is made worse by the sharp edges of the chamber wall in the opening for the detection window. Also, higher operating voltages appear the make the arcing problem worse.

The pertinent prior art is as follows. U.S. Pat. No. 4,954,212 (Gabriel et. al.) shows an endpoint detection system and method for plasma etching. U.S. Pat. No. 5,567, 268 (Kadomura) shows a plasma etcher but does not discuss etch chamber endpoint detection window arcing problem.

However, the problem of arcing to the plasma chamber wall edge around the windows still exists and a solution is needed for this problem.

SUMMARY OF THE INVENTION

It is an object of the present invention to provide a protective shield for a window in a plasma etch chamber that prevents arcing around the window.

It is an object of the present invention to provide a protective shield for an end point detection window in a plasma etch chamber that prevents arcing around the window.

It is another object of the present invention to provide a protective shield for a end point detection window in a plasma etch chamber that prevents arcing around the window from the anodized chamber wall and prevents particle generation.

To accomplish the above objectives, the present invention provides a protective shield 40 for a plasma etcher. The protective shield 40 protects the chamber wall 30 around the etch detect window from plasma etching and electrical arcing. The invention comprises a plasma etcher 10 having a wall 30 surrounding a chamber 14. The plasma chamber wall 30 has an opening 16. The wall 30 has an inside face 30A and an outside face 30B. An opening edge 30C defines the opening 16. A window (i.e., window pane) 24 covers over the opening 16 and over a portion of the outside face 30B of the wall.

The protective shield 40 of the invention covers the opening edge 30C around the opening 16 and covers a portion of the inside face 30A of the wall 30 around the opening 16. The shield 40 is composed of an electrically insulating and plasma resistant material. The shield prevents the chamber from arching and generating particles and extend the lifetime of said well 30.

The protective shield of the present invention protects the chamber edge around the endpoint detect window from arcing. The shield is composed of an electrically insulating plasma resistant material. The protective shield eliminates the contamination originating with the plasma arcing problem. This improves product yields and allows more runs between plasma chamber maintenance.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which:

FIGS. 1A and 1B are plasma etch systems having etch detection windows according to the prior art.

DETAILED DESCRIPTION OF THE PREFERRED EMBODIMENTS

The present invention will be described in detail with reference to the accompanying drawings. The present invention provides a protective shield 40 for a plasma etcher that eliminates arcing around the plasma endpoint detect window and around other windows in the chamber.

Figure 2:
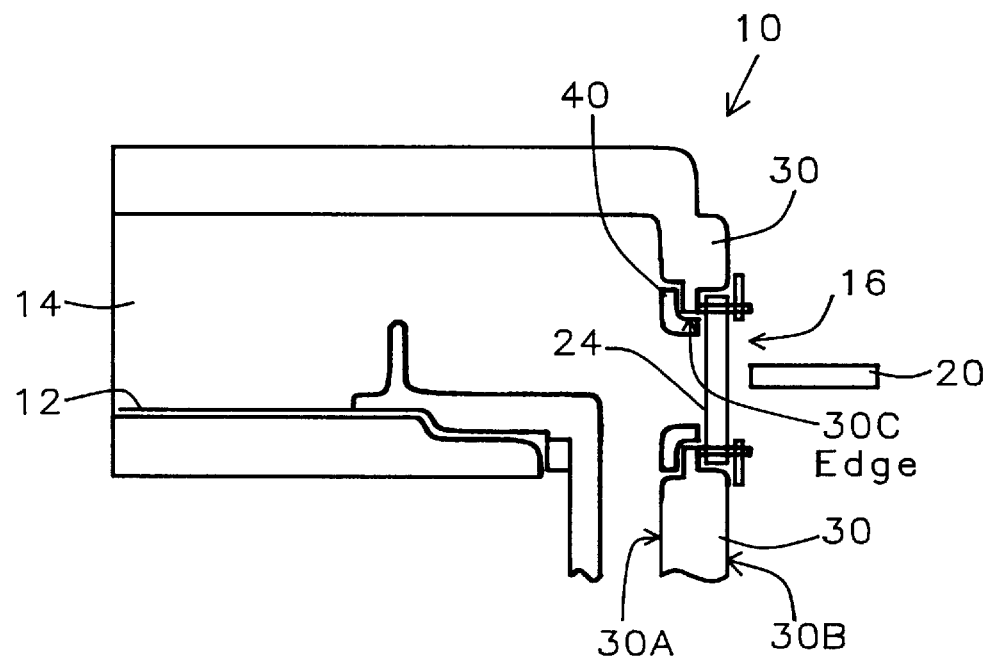
FIG. 2 is a cross sectional view of a plasma etch system having the protective shield 40 of the present invention covering the wall around the window.

As shown in FIG. 2, a plasma etcher 10 is provided having a plasma chamber wall 30 surrounding a chamber 14. The chamber is preferably composed of aluminum, steel, stainless steel, or Titanium material and is most preferably compose of aluminum. The shield can be implemented on typical plasma etchers such as: Applied Materials, model P5000, 3050 Bowers Avenue, Santa Clara, Calif., 95054, or LAM Research Model 9600, 4650 Cushing Parkway, Fremont Calif., 94538.

The chamber wall 30 preferably has a protective coating (not shown) (e.g., An anodized coating) made of $Al_2O_3$, with a thickness of between about 1000 and 3000 Å. The anodized coating protects the chamber wall from the plasma voltage.

The chamber wall 30 has an opening 16. The opening 16 is can be any shape including circular and rectangular and is preferably circular shaped. A rectangular/square opening 16 preferably has a length between 10 and 20 cm and a width between 0.5 and 3.0 cm. A round opening preferably has a diameter between about 2 and 8 cm.

The wall 30 has an inside face 30A and an outside face 30B. An opening edge 30C of the wall 30 defines the opening 16.

The plasma etcher has a transparent window (i.e., window pane) 24 over, covering, or filling the opening 16. The window 24 can cover over a portion of the outside face 30B of the wall as shown in FIG. 2A. The window 24 is preferably composed of quartz glass. The window covers the opening.

Still referring to FIG. 2, the protective shield 40 of the present invention preferably covers the opening edge 30C around the opening 16 and preferably covers a portion of the inside face 30A of the wall 30 around the opening 16. Preferably, the shield covers between 5 and 20 mm of the inside face 30A around the opening 16.

The protective shield 40 covers the chamber wall inside face 30A and edge of the chamber wall 30C. (see FIG. 3). The protective shield of the present invention can have any shape that covers inside face 30 and edge of the chamber wall 30C for any size opening 16 in the chamber wall 30. The protective shield can have many other forms/shapes/ structures than are illustrated as long as the protective shield covers (electrically insulates) the window edges 30C and inside face 30A near the window from the plasma as will be obvious to those skilled in the art.

The protective shield preferably has a cross sectional "L" shape with a first and a second extending portions. The first extending portion covering a portion of the inside face 30A of the wall and the second portion covering the opening edge 30C and a portion of the window pane.

A rectangular/square shield 40 preferably has a length between 10 and 20 cm and a width between 0.5 and 3.0 cm. A round shield 40 preferably has a diameter between about 2 and 8 cm.

The shield 40 is composed is of an electrically insulating and plasma resistant material. The shield 40 has the property of allowing polymer that is generated during the etches to tightly adhere to the shield so that the polymer material does not flake off. The plasma etch processes often produce a polymer to control the rate of etching and redeposition on the wafer. The material of the shield will have the property whereby the polymer material would stick to the shield material and prevent the polymer from peeling off.

The shield is preferably composed of Vespel™, Ardel™ or polytetrafloroethlyene (e.g., Teflon™). The shield is most preferably composed of Vespel™ or Ardel™. A preferred material is the Vespel model SP-1 from Dupont Company in Wilmington Del., USA. The protective shield composed preferably has a thickness in a range of between about 0.5 and 3 mm.

The shield prevents the chamber from arching and generating particles and extends the lifetime of said well 30.

Figure 3:
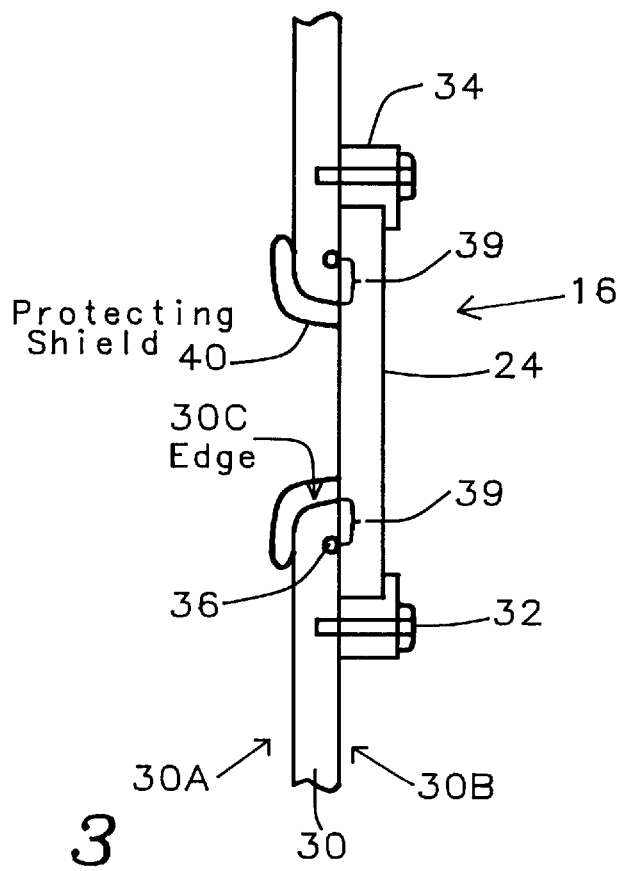
FIG. 3 is a cross sectional view of the protective shield of the present invention.

FIG. 3 shows another close up cross sectional view of the protective shield of the present invention. As can be seen in FIG. 3, the protective shield covers the top edge 30C and a portion of the inside face 30a around the opening 16. Fastener 32 secures the plate 34 over the window 24. Areas 39 on the chamber wall 30 show the area where much arcing occurred with the unshielded endpoint detection window. In these areas, the sharp edges and degradation of the anodic coating of the chamber wall caused arcing. Arcing also occurs along the edge 30C.

Figure 4:
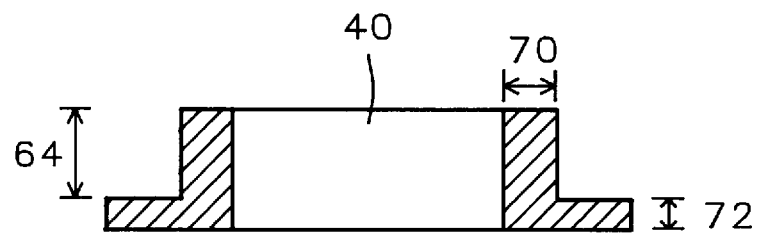
FIG. 4 is a cut away cross sectional view taken along the axis 4/4' shown in FIG. 5 of the protective shield of the present invention.
Figure 5:
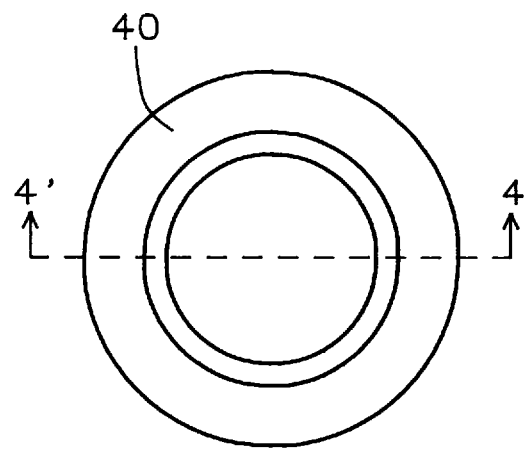
FIG. 5 is a top view of the protective shield of the invention.

FIGS. 4 and 5 show a preferred embodiment of the shield where the shield 40 has a circular shape. FIG. 4 shows a cross sectional view of the protective shield along the axis 4 shown in top view FIG. 5. The shield 40 has a thickness 70 between about 0.5 and 3 mm. The shield has a lip width 72 in a range between about 0.5 to 3 mm. The shield preferably has a height 64 in a range of between about 5 and 20 mm.

The protective shield of the present invention protects the chamber edge around the endpoint detect window from arcing. The shield is composed of an electrically insulating plasma resistant material. The protective shield eliminates the contamination originating with the plasma arcing problem. This improves product yields and allows more runs between plasma chamber maintenance. In addition, the characteristic parameters, such as endpoint curve, and DC-bias trend, are more consistent run to run.

While the invention has been particularly shown and described with reference to the preferred embodiments thereof, it will be understood by those skilled in the art that various changes in form and details may be made without departing from the spirit and scope of the invention.

What is claimed is:

1. A protective shield around a window in a plasma etcher comprising:

a plasma etcher having a wall surrounding a chamber, an opening in said wall; said wall having an inside face and an outside face; said inside face of said wall covered by a protective coating; an opening edge, of said wall defining said opening; a window pane over said opening and over a portion of said outside face of said wall; the improvement being;

a) a shield covering said opening edge of said wall adjacent to said opening and a portion of said inside face of said wall adjacent to said opening; said shield comprised of an electrically insulating and plasma resistant material whereby said shield prevents the chamber from arcing and generating particles and extend the lifetime of said wall.

2. The protective shield of claim 1 wherein said shield has a cross sectional "L" shape and comprises a first extending portion and a second extending portion; said first extending portion covering a portion of said inside face of said wall and said second extending portion covering said opening edge and a portion of said window pane.

3. The protective shield of claim 1 wherein said shield covers said opening edge around said opening and covers a portion between 5 and 20 mm of the inside face of the wall around said opening.

4. The protective shield of claim 1 wherein said protective shield is comprised of polytetrafluoroethylene and has a thickness in a range of between 0.5 and 3.0 mm.

5. The protective shield of claim 1 wherein said window pane has a circular shape and said shield has a cross sectional "L" shape and comprises a first extending portion and a second extending portion; said first extending portion covering a portion of said inside face of said wall and said second extending portion covering said opening edge and a portion of said window pane and said shield covers said opening edge around said opening and covers a portion between 5 and 20 mm of the inside face of the wall around said opening.

6. The protective shield of claim 1 wherein said window pane covers said opening and is comprised of quartz.

7. The protective shield of claim 1 wherein said chamber comprised of a material selected from the group consisting of aluminum, stainless steel and Ti.

8. The protective shield of claim 1 wherein said protective coating is comprised of aluminum oxide and said protective coating being an electrical insulator.

9. A protective shield around a window in a plasma etcher comprising:

a plasma etcher having a wall surrounding a chamber, an opening in said wall; said wall having an inside face and an outside face; said inside face of said wall covered by a protective coating; an opening edge, of said wall, defining said opening; a window pane over said opening and over a portion of said outside face of said wall; the improvement being;

a shield covering said opening edge of said wall around said opening and a portion of said inside face of said wall around said opening; and covering portions of said protective coating adjacent to said opening; said shield comprised of an electrically insulating and plasma resistant material; said protective shield has a thickness in a range of between 0.5 and 3.0 mm; whereby said shield prevents the chamber from arcing and generating particles and extend the lifetime of said well.

10. A protective shield around a horizontal window in a plasma etcher comprising:

a plasma etcher having a wall surrounding a chamber, an opening in said wall; said wall having an inside face and an outside face; said inside face of said wall covered by a protective coating; a opening edge, of said wall, defining said opening; a window pane over said opening and over a portion of said outside face of said wall; said chamber comprised of a material selected from the group consisting of aluminum, stainless-steel and Ti; said chamber has a coating of anodized material composed of aluminum oxide and said coating being an electrical insulator;

a shield covering said opening edge of said wall around said opening and a portion of said inside face of said wall around said opening; said shield covers said opening edge around said opening and covers a portion between about 5 and 20 mm of the inside face of the wall 30 around the opening; and covering portions of said protective coating adjacent to said opening; and covering a portion of said window pane adjacent to said opening; said shield comprised of an electrically insulating and plasma resistant material; said protective shield is comprised of polytetrafluoroethlyene and has a thickness in a range of between 0.5 and 3.0 mm; whereby said shield prevents the chamber from arcing and generating particles and extend the lifetime of said well.

11. The protective shield of claim 10 wherein said shield has a cross sectional "L" shape and comprises a first extending portion and a second extending portion; said first extending portion covering a portion of said inside face of said wall and said second extending portion covering said opening edge and a portion of said window pane.

12. The method of claim 1 wherein said window pane is an end point detection window.

13. The method of claim 1 wherein said shield covers a portion of said protective coating adjacent to said opening.

14. The method of claim 1 wherein said shield covers a portion of said window pane adjacent to said opening.

15. The method of claim 9 wherein said shield covers a portion of said window pane adjacent to said opening.

* * * * *